United States Patent
Chang et al.

(10) Patent No.: US 7,279,985 B2
(45) Date of Patent: Oct. 9, 2007

(54) REGULATED CASCODE AMPLIFIER WITH SMALL-SIZED FEED-BACK AMPLIFIER

(75) Inventors: Il-Kwon Chang, Gimpo-Si (KR);
Yong-Weon Jeon, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 11/053,158

(22) Filed: Feb. 7, 2005

(65) Prior Publication Data

US 2005/0179500 A1    Aug. 18, 2005

(30) Foreign Application Priority Data

Feb. 12, 2004  (KR) ................. 10-2004-0009243

(51) Int. Cl.
*H03F 1/22* (2006.01)
(52) U.S. Cl. .......................... 330/311; 330/98
(58) Field of Classification Search ............ 330/85, 330/98–99, 311
See application file for complete search history.

(56) References Cited

U.S. PATENT DOCUMENTS

| | | | |
|---|---|---|---|
| 5,285,171 A * | 2/1994 | Bult et al. | 330/277 |
| 5,451,909 A * | 9/1995 | Fattaruso | 330/311 |
| 5,892,356 A | 4/1999 | Chuang | 323/315 |
| 6,707,286 B1 * | 3/2004 | Gregoire, Jr. | 323/316 |
| 6,965,270 B1 * | 11/2005 | Ross | 330/311 |
| 7,026,843 B1 * | 4/2006 | Yang et al. | 327/51 |
| 2006/0139097 A1 * | 6/2006 | Mukherjee et al. | 330/257 |

OTHER PUBLICATIONS

Korean Patent Application No. 10-1994-0003108 to Fattaruso entitled "Feedback Amplifier for Regulated Cascode Gain Enhancement" (w/ English Abstract page).
European Patent Application No. 90201096.6 to Bult et al. entitled "Amplifier Arrangement".
Japanese Patent No. JP7022858 to Fattaruso, having Publication date of Sep. 21, 1994 (w/ English Abstract page).
Korean Patent Application No. 950005560 to Kim et al, having Publication date of Aug. 14, 1998 (w/ English Abstract page).

* cited by examiner

*Primary Examiner*—Robert Pascal
*Assistant Examiner*—Hieu Nguyen
(74) *Attorney, Agent, or Firm*—Monica H. Choi

(57) ABSTRACT

A regulated cascode amplifier includes a main cascode amplifier and a feed-back amplifier. The main cascode amplifier has an input transistor coupled in a stack with an output transistor at an input control node. The feed-back amplifier including a plurality of transistors with gates of the transistors being coupled together to the input control node and with drains of the transistors being coupled together at a gate of the output transistor. The transistors of the feed-back amplifier are biased from connections to the main cascode amplifier for smaller chip area.

20 Claims, 2 Drawing Sheets

US 7,279,985 B2

REGULATED CASCODE AMPLIFIER WITH SMALL-SIZED FEED-BACK AMPLIFIER

BACKGROUND OF THE INVENTION

This application claims priority to Korean Patent Application No. 2004-9243, filed on Feb. 12, 2004, in the Korean Intellectual Property Office, the disclosure of which is incorporated herein in its entirety by reference.

1. Field of the Invention

The present invention relates generally to amplifier circuits, and more particularly to a regulated cascode amplifier with a simple small-sized feed-back amplifier.

2. Description of the Related Art

Generally, a cascode amplifier is used as a gain stage of differential amplifiers for providing large output impedance and large voltage gain. FIG. 1 shows a circuit diagram of a conventional cascode amplifier 100. The cascode amplifier 100 includes a current source IB1, a first NMOSFET (N-channel metal oxide semiconductor field effect transistor) 101, and a second NMOSFET 103.

The cascode amplifier 100 amplifies an input voltage Vin to generate an output voltage Vout. The input voltage Vin is applied on a gate of the first NMOSFET 101, and a source of the first NMOSFET 101 is coupled to a ground node (GND). A bias voltage VB1 is applied on a gate of the second NMOSFET 103 such that a constant current flows through the second NMOSFET 103. The NMOSFETs 101 and 103 are stacked with a source of the second NMOSFET 103 being coupled to a drain of the first NMOSFET 101.

A drain of the second NMOSFET 103 is coupled to the current source IB1 at a node that generates the output voltage Vout. An output impedance Rout of the cascode amplifier 100 at the drain of the second NMOSFET 103 is expressed as follows:

$$Rout = rds2 + rds1(1 + gm2\,rds2)$$

rds1 is a resistance between the drain and the source of the first NMOSFET 101, rds2 is a resistance between the source and the drain of the second NMOSFET 103, and gm2 is a transconductance of the second NSMOFET 103.

The voltage gain Av of the cascode amplifier 100 is expressed as follows:

$$Av = Vout/Vin \approx gm1\,rds1(1 + gm2\,rds2)$$

gm1 is a transconductance of the first NSMOFET 101. Such equations illustrate that the output impedance Rout and the voltage gain Av are relatively large for the cascode amplifier 100.

FIG. 2 shows a circuit diagram of a conventional regulated cascode amplifier 200, as disclosed in IEEE JSSC SC-22 (pp. 287–294) by E. Sackinger dated 1987. The conventional regulated cascode amplifier 200 includes a main cascode amplifier 210 and a feedback amplifier 220.

The regulated cascode amplifier 200 amplifies an input voltage Vin to generate an output voltage Vout. The main cascode amplifier 210 includes a current source IB2, a first NMOSFET (N-channel metal oxide semiconductor field effect transistor) 211, and a second NMOSFET 213.

The input voltage Vin is applied on a gate of the first NMOSFET 211, and a source of the first NMOSFET 101 is coupled to a ground node (GND). The NMOSFETs 211 and 213 are stacked with a source of the second NMOSFET 213 being coupled to a drain of the first NMOSFET 211. A drain of the second NMOSFET 213 is coupled to the current source IB2 at a node that generates the output voltage Vout.

The feedback amplifier 220 includes a third NMOSFET 221 and a PMOSFET (P-channel metal oxide semiconductor field effect transistor) 223. A bias voltage VB2 is applied on a gate of the PMOSFET 223 such that a constant current flows through the PMOSFET 223.

An output impedance Rout of the regulated cascode amplifier 200 at the drain of the second NMOSFET 213 is expressed as follows:

$$Rout = rds2 + rds1[1 + gm2\,rds2(1 + gm3(rds3 \| rds4))],$$

rds1, rds2, rds3, and rds4 are each a respective resistance between the respective source and the respective drain of the first, second, and third NMOSFETs 211, 213, and 221, and the PMSOFET 223, respectively. In addition, (rds3∥rds4) is an equivalent resistance of rds3 and rds4 in parallel. Furthermore, gm2 and gm3 are each the transconductance of the second and third NMOSFETs 213 and 221, respectively.

The voltage gain Av of the regulated cascode amplifier 200 is expressed as follows:

$$Av = Vout/Vin \approx gm1\,rds1[1 + gm2\,rds2(1 + gm3(rds3 \| rds4))],$$

gm1 is a transconductance of the first NSMOFET 211. Such equations illustrate that the output impedance Rout and the voltage gain Av are relatively large for the regulated cascode amplifier 200. However, the conventional regulated cascode amplifier 200 has large chip area because a bias circuit is needed for generating the bias voltage VB2.

SUMMARY OF THE INVENTION

Accordingly, a regulated cascode amplifier of the present invention has a feed-back amplifier that is biased by connections to a main cascode amplifier.

In one aspect of the present invention, a regulated cascode amplifier includes a main cascode amplifier and a feed-back amplifier. The main cascode amplifier has an input transistor stacked with an output transistor, and the input and output transistors are coupled together at an input control node. The feed-back amplifier includes a plurality of transistors with gates of the transistors being coupled together to the input control node and with drains of the transistors being coupled together at a gate of the output transistor.

In an embodiment of the present invention, the input transistor is coupled to an input signal and a power supply voltage, and the output transistor is coupled to a current source at an output node.

In an example embodiment of the present invention, the input transistor and the output transistor are an input NMOSFET (N-channel metal oxide semiconductor field effect transistor) and an output NMOSFET. The input NMOSFET has a source coupled to a low supply voltage, and the output NMOSFET has a source coupled to a drain of the input NMOSFET at the input control node.

In another embodiment of the present invention, the input transistor and the output transistor are an input PMOSFET (P-channel metal oxide semiconductor field effect transistor) and an output PMOSFET. The input PMOSFET has a source coupled to a high supply voltage, and the output PMOSFET has a source coupled to a drain of the input PMOSFET at the input control node.

In a further embodiment of the present invention, the feed-back amplifier includes a first transistor and a second transistor. The second transistor has a gate coupled to a gate of the first transistor for inputting an input control signal from the input control node. The second transistor also has a drain coupled to a drain of the first transistor for generating an output control signal applied on the gate of the output transistor.

In an example embodiment of the feed-back amplifier, the first transistor is a PMOSFET (P-channel metal oxide semiconductor field effect transistor) having a source coupled to a high supply voltage, and the second transistor is an NMOSFET (N-channel metal oxide semiconductor field effect transistor) having a source coupled to a low supply voltage.

In a further embodiment of the present invention, the PMOSFET and the NMOSFET are coupled to form an inverter within the feed-back amplifier. In that case, the output control signal is adjusted opposite from a change in the input control signal for negative feed-back.

In this manner, the transistors of the feed-back amplifier are biased from connections to the main cascode amplifier. Thus, a bias circuit is not used for biasing the feed-back amplifier such that the regulated cascode amplifier is fabricated with reduced area.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, and 4 refer to elements having similar structure and/or function.

DETAILED DESCRIPTION OF THE INVENTION

Figure 1:
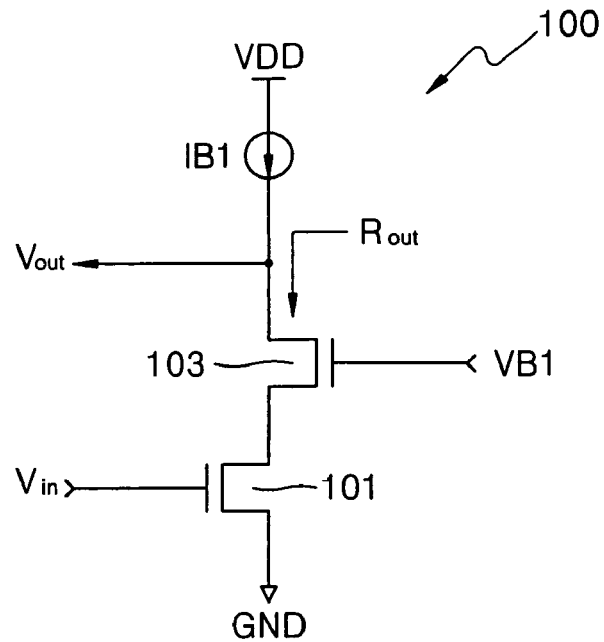
FIG. 1 shows a circuit diagram of a conventional cascode amplifier.
Figure 2:
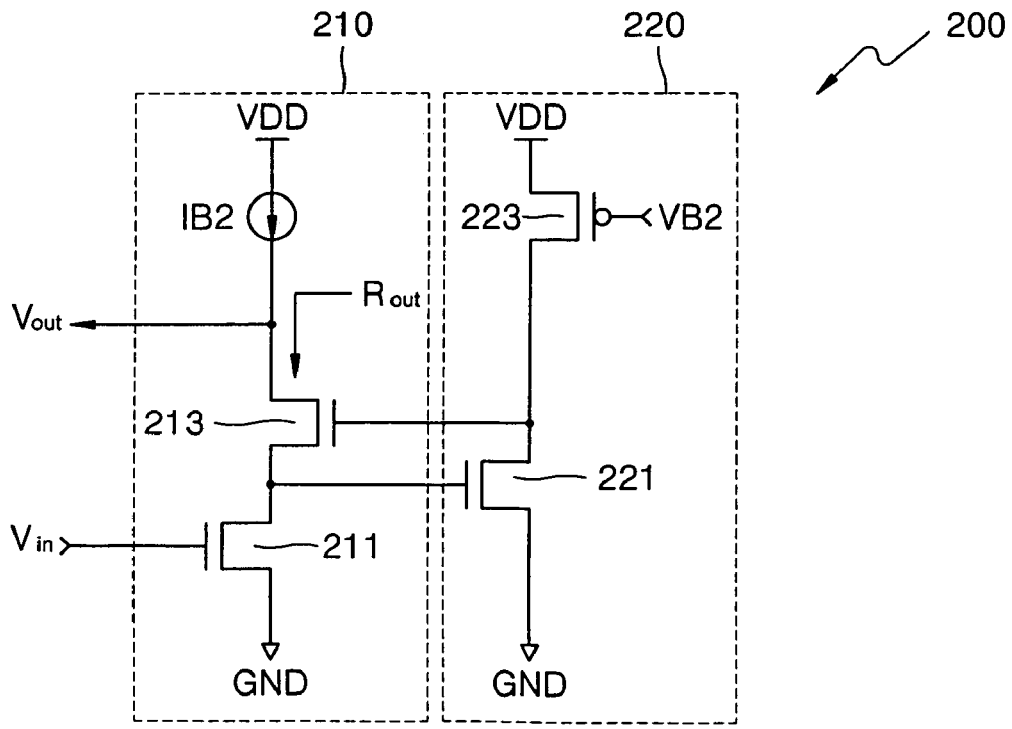
FIG. 2 shows a circuit diagram of a conventional regulated cascode amplifier having a feed-back amplifier of the prior art.
Figure 3:
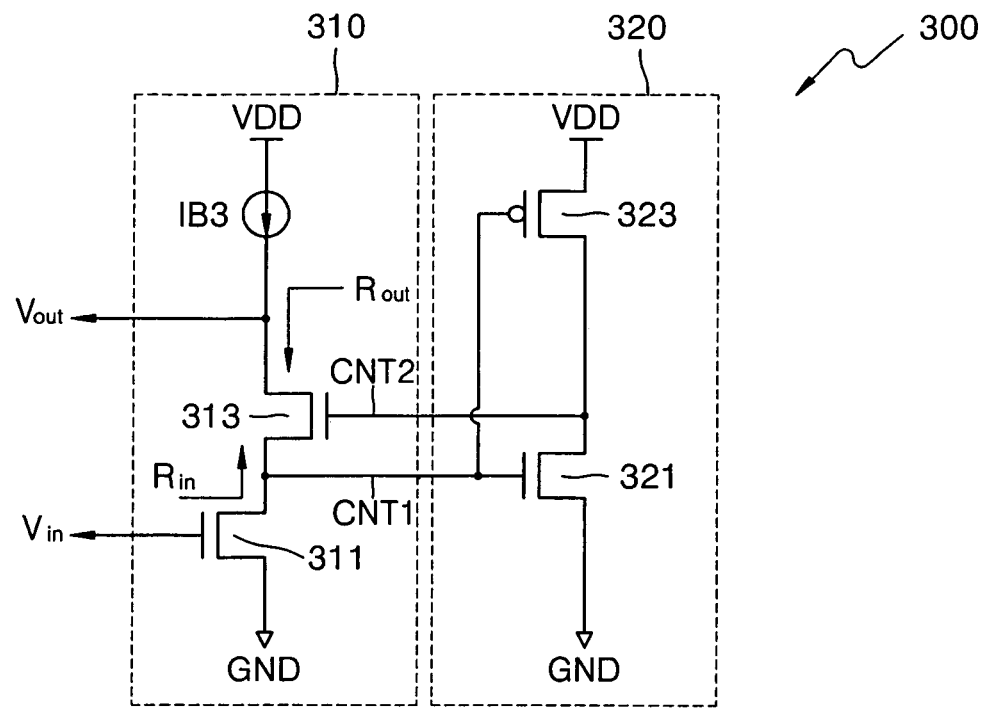
FIG. 3 shows a circuit diagram of a regulated cascode amplifier with a small-sized feed-back amplifier and with a main cascode amplifier having a stack of NMOSFETs, according to a first embodiment of the present invention.

FIG. 3 shows a circuit diagram of a regulated cascode amplifier 300 according to a first embodiment of the present invention. The regulated cascode amplifier 300 includes a main cascode amplifier 310 and a feedback amplifier 320. The regulated cascode amplifier 300 amplifies an input voltage Vin to generate an output voltage Vout.

The main cascode amplifier 310 includes a current source IB3, a first NMOSFET (N-channel metal oxide semiconductor field effect transistor) 311, and a second NMOSFET 313. An input voltage Vin is applied on a gate of the first NMOSFET 311 that is an input transistor. A source of the first NMOSFET 311 is coupled to a low supply voltage that is the ground voltage (GND), in one embodiment of the present invention.

The NMOSFETs 311 and 313 are stacked with a source of the second NMOSFET 313 being coupled to a drain of the first NMOSFET 311. A drain of the second NMOSFET 313 that is an output transistor is coupled to the current source IB3 at a node that generates the output voltage Vout.

The feedback amplifier 320 includes a third NMOSFET 321 and a PMOSFET (P-channel metal oxide semiconductor field effect transistor) 323. The NMOSFET 321 and the PMOSFET 323 are coupled as an inverter within the feedback amplifier 320. Thus, the gates of the third NMOSFET 321 and the PMOSFET 323 are coupled together to form an input control node having an input control signal CNT1 applied thereon. In addition, the drains of the third NMOSFET 321 and the PMOSFET 323 are coupled together at an output control node having an output control signal CNT2 generated thereon.

The source of the third NMOSFET 321 is coupled to a low power supply voltage such as ground (GND), and the source of the PMOSFET 323 is coupled to a high power supply voltage (VDD). The input control node with the signal CNT1 applied thereon is coupled to the drain of the first NMOSFET 311 and the source of the second NMOSFET 313. The output control node having the signal CNT2 generated thereon is coupled to the gate of the second NMOSFET 313.

Thus, the feed-back amplifier 320 is biased from connections to the main cascode amplifier 310 (and the power supply voltages VDD and VSS) such that a biasing circuit is not used. Without a biasing circuit, the regulated cascode amplifier 300 is fabricated with smaller chip area and with simpler circuit structure.

The feed-back amplifier 320 generates the output control signal CNT2 from the input control signal CNT1. Such an output control signal CNT2 is applied back on the main cascode amplifier 310 for stabilizing operation of the main cascode amplifier 310. Because the third NMOSFET 321 and the PMOSFET 323 are coupled as an inverter within the feed-back amplifier 320, the output control signal CNT2 is generated with negative feed-back from the input control signal CNT1. Thus, the output control signal CNT2 is adjusted opposite from a change in the input control signal CNT1.

For example, assume that a drain voltage of the first NMOSFET 311 is increased by $\Delta V$ from external noise (or the like). In that case, a gate voltage of the third NMOSFET 321 is increased by $\Delta V$ which in turn causes an increase in a drain current of the third NMOSFET 321. At the same time, a gate voltage of the PMOSFET 323 is decreased by $\Delta V$ which in turn causes a decrease in a drain current of the PMOSFET 323.

Because of such current changes, the output control signal CNT2 decreases from the $\Delta V$ increase of the input control signal CNT1. Because the output control signal CNT2 is applied at the gate of the second NMOSFET 313, the voltage (i.e., CNT1) at the source of the second NMOSFET 313 is also subsequently decreased. Similarly, if the drain voltage (i.e., the input control signal CNT1) of the first NMOSFET 311 is decreased by $\Delta V$, the output control signal CNT2 is increased to subsequently increase the drain voltage CNT1 of the first NMOSFET 311.

In this manner, the drain voltage of the first NMOSFET 311 is maintained constant regardless of an increase or decrease of such a drain voltage from noise or the like. Thus, the feed-back amplifier 320 provides negative feed-back to stabilize operation of the main cascode amplifier 310.

An output impedance Rout of the regulated cascode amplifier 300 at the drain of the second NMOSFET 313 is expressed as follows:

$$Rout = rds2 + rds1[1 + gm2 \, rds2(1 + (gm3 + gm4)(rds3 \| rds4))],$$

rds1, rds2, rds3, and rds4 are each a respective resistance between the respective source and the respective drain of the first, second, and third NMOSFETs 311, 313, 321, and the PMOSFET 323, respectively. In addition, (rds3∥rds4) is an equivalent resistance of rds3 and rds4 in parallel. Furthermore, gm2, gm3, and gm4 are a respective transconductance of the second and third NMOSFETs 313 and 321 and the PMOSFET 323, respectively.

The voltage gain Av of the regulated cascode amplifier 300 is expressed as follows:

$$Av = Vout/Vin \approx gm1 rds1[1+gm2 rds2(1+(gm3+gm4)(rds3\|rds4))].$$

gm1 is a transconductance of the first NSMOFET 311.

Such equations illustrate that the output impedance Rout and the voltage gain Av are relatively large for the regulated cascode amplifier 300. As a result, the regulated cascode amplifier 300 may be used to particular advantage as an amplifier stage of an operational amplifier.

Meanwhile, an input impedance Rin at the drain of the first NMOSFET 311 and the source of the second NMOSFET 313 for the regulated cascode amplifier 300 is expressed as follows:

$$Rin = 1/[1+gm2(1+(gm3+gm4)(rds3\|rds4))].$$

Thus, the input impedance Rin is less than 1/gm2. With such a low input impedance Rin, the regulated cascode amplifier 300 may be used to particular advantage for an input stage of a current mode receiver.

Figure 4:
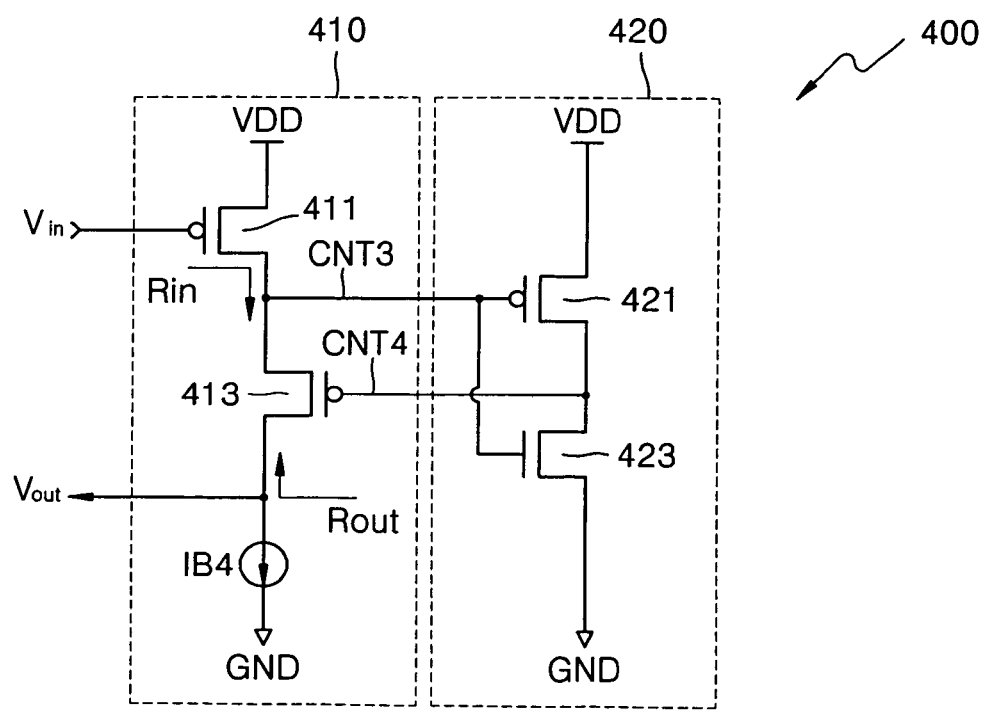
FIG. 4 shows a circuit diagram of a regulated cascode amplifier with a small-sized feed-back amplifier and with a main cascode amplifier having a stack of PMOSFETs, according to a second embodiment of the present invention.

FIG. 4 is a circuit diagram of a regulated cascode amplifier 400 according to a second embodiment of the present invention. The cascode amplifier 400 of FIG. 4 is similar to the cascode amplifier 300 of FIG. 3. However, the cascode amplifier 400 of FIG. 4 has a stack of PMOSFETs 411 and 413, whereas the cascode amplifier 300 of FIG. 3 has a stack of the NMOSFETs 311 and 313.

Referring to FIG. 4, the regulated cascode amplifier 400 includes a main cascode amplifier 410 and a feed-back amplifier 420. The regulated cascode amplifier 400 amplifies an input voltage Vin to generate an output voltage Vout. The cascode amplifier 410 includes a first PMOSFET 411, a second PMOSFET 413, and a current source IB4.

An input voltage Vin is applied on a gate of the first PMOSFET 411 that is an input transistor. A source of the first PMOSFET 411 is coupled to a high power supply voltage (VDD), in one embodiment of the present invention.

The PMOSFETs 411 and 413 are stacked with a source of the second PMOSFET 413 being coupled to a drain of the first PMOSFET 411. A drain of the second PMOSFET 413 that is an output transistor is coupled to the current source IB4 at a node that generates the output voltage Vout.

The feedback amplifier 420 includes an NMOSFET 421 and a third PMOSFET 423. The NMOSFET 421 and the third PMOSFET 423 are coupled as an inverter within the feed-back amplifier 420. Thus, the gates of the NMOSFET 421 and the third PMOSFET 423 are coupled together to form an input control node having an input control signal CNT3 applied thereon. In addition, the drains of the NMOSFET 421 and the third PMOSFET 423 are coupled together at an output control node having an output control signal CNT4 generated thereon.

The source of the NMOSFET 421 is coupled to a low power supply voltage such as ground (GND), and the source of the third PMOSFET 423 is coupled to a high power supply voltage (VDD). The input control node with the signal CNT3 applied thereon is coupled to the drain of the first PMOSFET 411 and the source of the second PMOSFET 413. The output control node having the signal CNT4 generated thereon is coupled to the gate of the second PMOSFET 413.

Thus, the feed-back amplifier 420 is biased from connections to the main cascode amplifier 410 (and the power supply voltages VDD and VSS such that a biasing circuit is not used. Without a biasing circuit, the regulated cascode amplifier 400 is fabricated with smaller chip area and with simpler circuit structure.

The regulated cascode amplifier 400 of FIG. 4 operates similarly to the regulated cascode amplifier 300 of FIG. 3. Thus, the feed-back amplifier 420 generates the output control signal CNT4 with negative feed-back from the input control signal CNT3 for stabilizing operation of the main cascode amplifier 410. In addition, the regulated cascode amplifier 400 of FIG. 4 has similar output impedance Rout, voltage gain Av, and input impedance Rin as described above for the regulated cascode amplifier 300 of FIG. 3.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, the present invention may be practiced with other types of transistors aside from the examples of the NMOSFETs and PMOSFETs illustrated and described herein.

The present invention is limited only as defined in the following claims and equivalents thereof.

What is claimed is:

1. A feed-back amplifier within a regulated cascode amplifier comprising:
   a first transistor; and
   a second transistor having a gate coupled to a gate of the first transistor for inputting an input control signal from a main cascode amplifier, and having a drain coupled to a drain of the first transistor for generating an output control signal from the input control signal for stabilizing operation of the main cascode amplifier,,
   wherein the input control signal generated directly from a stack of transistors of the main cascode amplifier is applied directly on the gates of the first and second transistors.

2. The feed-back amplifier, of claim 1, wherein the first transistor is a PMOSFET (P-channel metal oxide semiconductor field effect transistor) having a source directly connected to a high supply voltage, and wherein the second transistor is an NMOSFET (N-channel metal oxide semiconductor field effect transistor) having a source directly connected to a low supply voltage.

3. The feed-back amplifier of claim 2, wherein the PMOSFET and the NMOSFET are coupled to form an inverter.

4. The feed-back amplifier of claim 2, wherein the high supply voltage is a positive supply voltage, and wherein the low supply voltage is ground.

5. The feed-back amplifier of claim 1, wherein the output control signal is adjusted opposite from a change in the input control signal for negative feed-back.

6. A regulated cascode amplifier comprising:
   a main cascode amplifier having an input transistor stacked with an output transistor, wherein the input and output transistors are connected together at an input control node; and
   a feed-back amplifier including a plurality of transistors with gates of the transistors being connected together directly to the input control node and with drains of the transistors being coupled together at a gate of the output transistor.

7. The regulated cascode amplifier of claim 6, wherein the input transistor is coupled to an input signal and a power supply voltage, and wherein the output transistor is coupled to a current source at an output node.

8. The regulated cascode amplifier of claim 6, wherein the input transistor is an input NMOSFET (N-channel metal oxide semiconductor field effect transistor) having a source coupled to a low supply voltage, and wherein the output transistor is an output NMOSFET (N-channel metal oxide semiconductor field effect transistor) having a source coupled to a drain of the input NMOSFET at the input control node.

9. The regulated cascode amplifier of claim 6, wherein the input transistor is an input PMOSFET (P-channel metal oxide semiconductor field effect transistor) having a source coupled to a high supply voltage, and wherein the output transistor is an output PMOSFET (P-channel metal oxide semiconductor field effect transistor) having a source coupled to a drain of the input PMOSFET at the input control node.

10. The regulated cascode amplifier of claim 6, wherein the feed-back amplifier includes:
a first transistor; and
a second transistor having a gate coupled to a gate of the first transistor for inputting an input control signal from the input control node, and having a drain coupled to a drain of the first transistor for generating an output control signal applied on the gate of the output transistors,
wherein the input control signal generated directly from the main cascode amplifier is applied directly on the gates of the first and second transistors.

11. The regulated cascode amplifier of claim 10, wherein the first transistor is a PMOSFET (P-channel metal oxide semiconductor field effect transistor) having a source connected directly to a high supply voltage, and wherein the second transistor is an NMOSFET (N-channel metal oxide semiconductor field effect transistor) having a source connected directly to a low supply voltage.

12. The regulated cascode amplifier of claim 11, wherein the PMOSFET and the NMOSFET are coupled to form an inverter.

13. The regulated cascode amplifier of claim 11, wherein the high supply voltage is a positive supply voltage, and wherein the low supply voltage is ground.

14. The regulated cascode amplifier of claim 10, wherein the output control signal is adjusted opposite from a change in the input control signal for negative feed-back.

15. A regulated cascode amplifier comprising:
a main cascode amplifier having an input transistor stacked with an output transistor and generating an input control signal; and
a feed-back amplifier including a plurality of transistors with gates of the transistors being coupled together and with drains of the transistors being coupled together, the feed-back amplifier including:
means for stabilizing operation of the main cascode amplifier from the input control signal that is applied directly on the gates of the transistors of the feed-back amplifier.

16. The regulated cascode amplifier of claim 15, wherein the input and output transistors are coupled together at an input control node that generates the input control signal.

17. The regulated cascode amplifier of claim 15, wherein the input and output transistors are comprised of a stack of NMOSFETs (N-channel metal oxide semiconductor field effect transistors) or a stack of PMOSFETs (N-channel metal oxide semiconductor field effect transistors).

18. The regulated cascode amplifier of claim 15, wherein the feed-back amplifier includes:
a first transistor; and
a second transistor having a gate coupled to a gate of the first transistor for inputting the input control signal, and having a drain coupled to a drain of the first transistor for generating an output control signal applied on a gate of the output transistors,
wherein the input control signal generated directly from the main cascode amplifier is applied directly on the gates of the first and second transistors.

19. The regulated cascode amplifier of claim 18, wherein the first and second transistors includes an NMOSFET (N-channel metal oxide semiconductor field effect transistor) and a PMOSFET (P-channel metal oxide semiconductor field effect transistor) coupled as an inverter.

20. The regulated cascode amplifier of claim 18, wherein the output control signal is adjusted opposite from a change in the input control signal for negative feed-back.

* * * * *